(12) United States Patent
Kase et al.

(10) Patent No.: US 7,768,296 B2
(45) Date of Patent: Aug. 3, 2010

(54) ELECTRONIC DEVICE AND METHOD

(75) Inventors: Kiyoshi Kase, Austin, TX (US); Dzung T. Tran, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 513 days.

(21) Appl. No.: 11/360,724

(22) Filed: Feb. 23, 2006

(65) Prior Publication Data

US 2007/0194804 A1 Aug. 23, 2007

(51) Int. Cl.
*H03K 19/003* (2006.01)
*H03K 17/16* (2006.01)

(52) U.S. Cl. .............................. 326/27; 326/17; 326/82

(58) Field of Classification Search .................... 326/82, 326/17, 83, 86; 327/108, 109; 323/222, 323/316
See application file for complete search history.

(56) References Cited

U.S. PATENT DOCUMENTS

| | | | | |
|---|---|---|---|---|
| 4,622,482 | A | | 11/1986 | Ganger |
| 4,672,243 | A | * | 6/1987 | Kirsch .......................... 326/71 |
| 4,779,013 | A | * | 10/1988 | Tanaka .......................... 326/27 |
| 4,829,199 | A | * | 5/1989 | Prater .......................... 326/27 |
| 5,546,021 | A | * | 8/1996 | Bizuneh et al. ................ 326/86 |
| 5,559,452 | A | * | 9/1996 | Saito ............................ 326/88 |
| 5,659,241 | A | * | 8/1997 | Horiuchi et al. .............. 323/222 |
| 5,818,258 | A | * | 10/1998 | Choi ........................... 326/83 |
| 5,847,946 | A | * | 12/1998 | Wong ........................... 363/60 |
| 6,204,654 | B1 | * | 3/2001 | Miranda et al. ............. 323/316 |
| 6,281,706 | B1 | * | 8/2001 | Wert et al. ..................... 326/83 |
| 6,653,878 | B2 | | 11/2003 | Nolan |
| 2005/0071706 | A1 | | 3/2005 | Deshmane |

OTHER PUBLICATIONS

"Design Guide for A Low Speed Buffer for the Universal Serial Bus," Revision 1.1, Dec. 1996, Intel Corporation, pp. 1-29.
"Draft MIPI Alliance Standard for D-PHY," MIPI Mobile Industry Processor Interface, Version 0.65, 2005 MIPI Alliance, Inc., pp. 1-92, Aug. 19, 2005.
International Search Report and Written Opinion for correlating PCT Patent Application No. PCT/US07/61119 dated Jul. 17, 2008.

* cited by examiner

*Primary Examiner*—Vibol Tan
*Assistant Examiner*—Crystal L Hammond

(57) ABSTRACT

A current boost module receives a signal from the input and the output of a buffer to determine whether the buffer is transitioning between logic states. When the buffer is transitioning, a boost current is provided to a load connected to the buffer output to supplement the current from buffer output, thereby facilitating transition of a signal at the load. The current boost module can shut down the boost current before the signal at the load completes its transition from one logic state to the other.

18 Claims, 2 Drawing Sheets

ELECTRONIC DEVICE AND METHOD

FIELD OF THE DISCLOSURE

This disclosure relates generally to electronic devices and more particularly to electronic devices and methods for reducing switching delays in electrical circuits.

BACKGROUND

In an effort to reduce the size of mobile electronic devices and increase their battery life, designs are utilizing lower operating voltages. However, designers of low voltage circuits face many challenges. One such challenge includes controlling the level of undesirable switching noise in the low voltage circuits. Low voltage/low noise designs typically have lower slew rates, larger dead times and increased signal propagation times. Slew rate is the speed at which a signal voltage changes, wherein dead time is the time delay between when a signal is applied to an input of a device and when the device switches to another state at its output. Typical transistors do not begin to switch until a signal on their input reaches the transistor's threshold voltage. For some low voltage circuit standards that require powering circuits with less than 1.4 volts, this can result in the threshold voltage of a transistor, such as a CMOS transistor, being equal to approximately one-half of its supply voltage. In this configuration, the input signal on a transistor must transition to approximately one-half of its total transition value before the output of the transistor will start to switch. This phenomenon can produce a long dead time where a signal transition is present at the input of a circuit for a large percentage of a clock period while no signal transition occurs at the circuit output. Accordingly, there is a need for circuits that can reduce signal propagation times.

BRIEF DESCRIPTION OF THE DRAWINGS

The present disclosure may be better understood, and its numerous features and advantages made apparent to those skilled in the art by referencing the accompanying drawings, in which like reference numbers indicate similar or identical items.

DETAILED DESCRIPTION

In accordance with the present disclosure, a device and method are disclosed that can reduce the dead time of switching circuits. Switching circuits can include a first buffer that drives a secondary buffer, such as data bus driver. The device and methods disclosed herein can provide a boost current to speed up the transition of a signal at an interconnect connected to the output of the first buffer during an initial portion of the signal's transition. Providing this boost current can reduce the dead time of the switching circuit. The boost current can be turned off during a second portion of the signal transition at the interconnect thereby preventing signal overshoot that can result in undesirable noise. In other embodiments the first buffer can drive any type of switching circuit such as an inverting or non-inverting buffer that receives a signal from the first buffer and drives an output load, such as bus driver. This secondary buffer is referred to herein as a receive/drive device.

In accordance with a specific embodiment of the present disclosure, a switching circuit or module can have a current boost module that receives a signal at the input of a buffer and a signal at the output of the buffer. The signals received from the buffer input and the buffer output can be used by the current boost module to determine that the buffer is in the process of transitioning between logic states. When this buffer transition is detected, the current boost module can provide a boost current to supplement the buffer's ability to drive the load, e.g., the interconnect, at its output.

In a particular embodiment, the current boost module determines when to provide the boost current and when to stop providing the boost current. The current boost module can stop providing the boost current in response to the voltage on the buffer's output node reaching a determined value, such as the threshold voltage of a transistor of the current boost module to ensure that a signal at the interconnect being driven by the buffer output will not overshoot the desired voltage and cause switching noise. Correspondingly, down stream devices connected to the buffer output such as a receive/drive device will transition according to the signal at the interconnect and can transmit a signal over a data bus, or other load, in accordance with a low voltage design.

Figure 1:
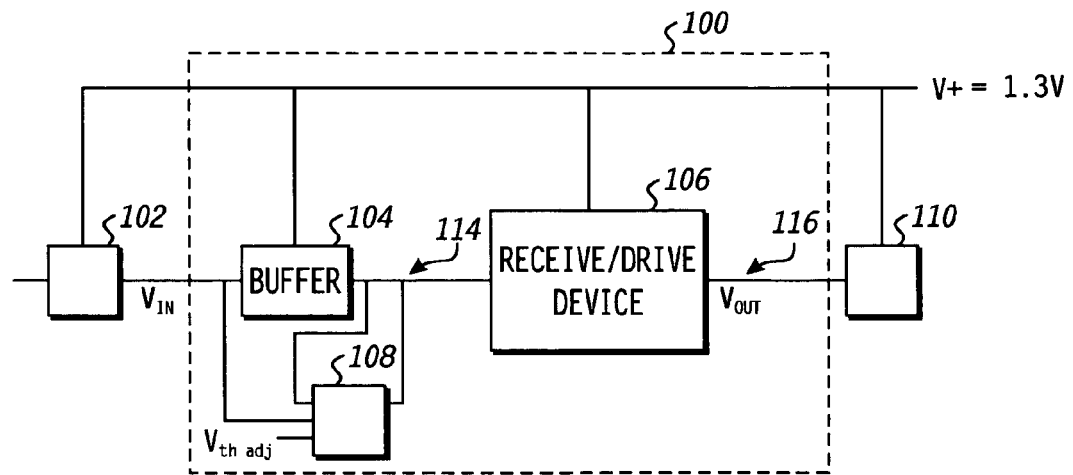
FIG. 1 is a block diagram of a device in accordance with a specific embodiment of the present disclosure.

Referring to FIG. 1, a block diagram having an exemplary switching module 100 that can provide data signals between a first subsystem 102 and a second subsystem 110 is illustrated. The switching module 100 can include a buffer 104, a current/boost module 108 and a receive/drive module 106. The receive/drive module 106 can itself include multiple modules or components. The receive/drive device 106 can be a robust driver that transmits signals to multiple destinations over a data bus. The multiple destinations can be internal subsystems, such as subsystem 110, or an external subsystem that transmits signals to external subsystems, such as subsystem 110. Examples of internal and external subsystems include memory subsystems, image processing subsystems, audio processing subsystems and the like. Thus, the receive/drive device 106 can drive modules that reside on the same integrated circuit or provide signals to external modules.

In a particular embodiment, the switching module 100 can comply with a Mobile Industry Processor Interface (MIPI) specification. The MIPI specification identifies low operating voltages, low signaling voltages and low noise levels. Thus, the exemplary configuration of the switching module 100 disclosed can comply with the MIPI voltage requirement of 1.3 volts.

Figure 3:
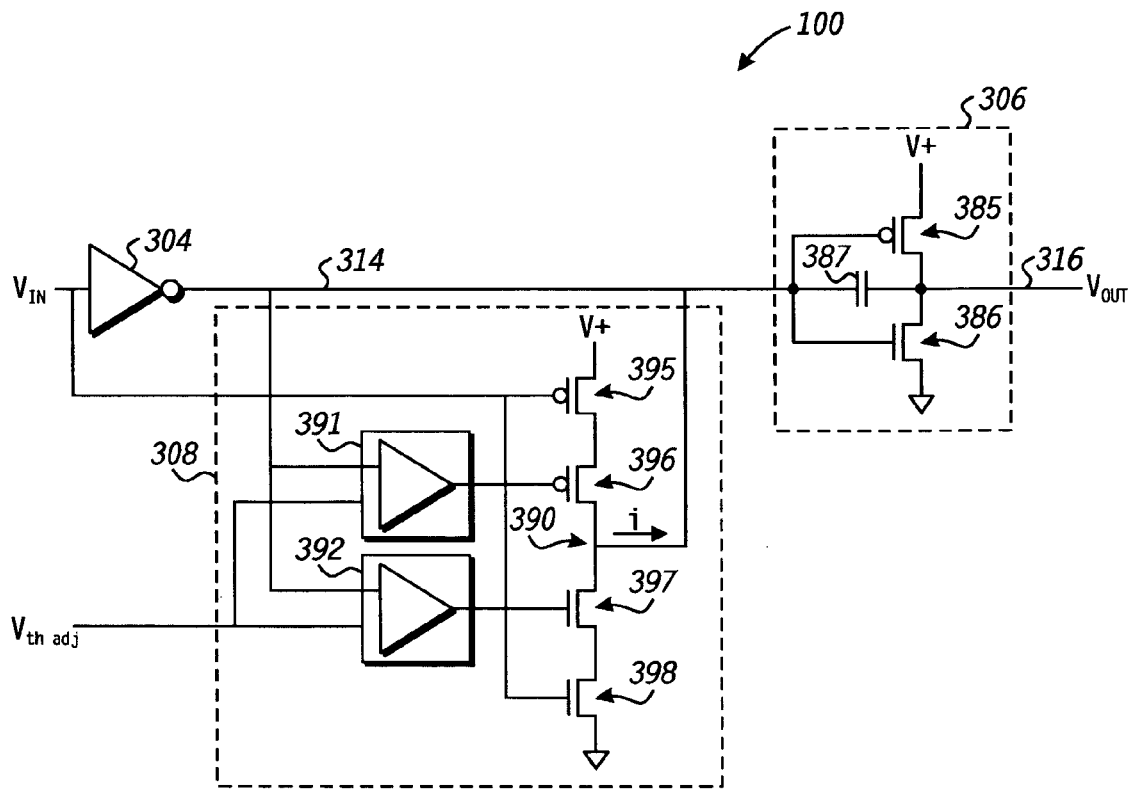
FIG. 3 is a circuit diagram corresponding to the device of FIG. 1 in accordance with a specific embodiment of the present disclosure.

In accordance with a specific embodiment, a capacitor can be placed between the buffer 104 output and supply power (V+) or the output node $V_{OUT}$ (see capacitor 387 of FIG. 3, for example). The capacitor can be relatively large to reduce switching noise in the system. In one embodiment, the capacitor can have a value as high as approximately 0.5 Pico-farads. A negative effect of this relatively large capacitance is that its presence slows the rise and fall time of a signal provided by the buffer 104 to the receive/drive device 106 via interconnect 114 by requiring an additional charge to transition a signal at interconnect 114. Note that interconnect 114 is typically made of one or more conductive traces formed at an integrated circuit that connect an output of buffer 104 to an input of receive/drive device 106. Thus, when buffer 104 attempts to raise the voltage on interconnect 114, the effects of capacitor can delay the rise of the voltage on interconnect 114. Since the buffer output voltage is typically less than the supply voltage (1.3 volts), and the threshold voltage of the receive/drive device can be as high as 0.7 volts, the voltage on interconnect 114 must rise to approximately one-half of its final value before the receive/drive device 106 begins to transition to another state.

In one embodiment, the current boost module 108 can assist the buffer 104 in driving signals at interconnect 114 more quickly during a first portion of the signal's transition. In one embodiment, this initial boost phase, or first portion of the total buffer output transition, can occur when the buffer 104 has a signal transitioning on its input and continues for a determined period after the signal at the buffer output begins its transition to speed up the slow transition time that can occur when only buffer drives interconnect 114.

After the current boost module detects a defined condition at the output of the buffer, such as a voltage threshold being met, the boost phase can be completed by no longer providing the boost current. Once the boost current is shut off, buffer 104 can complete the signal transition at interconnect 114 to a steady state value unassisted. The speed of this second portion or "unboosted phase" of the buffer output signal transition typically will not significantly affect the switching speed of the receive/drive device 106, and therefore a boost current is not needed during this portion of transition.

While a boost current could be provided for the entire buffer transition, by turning the boost current off during the second portion of the buffer transition, the introduction of noise caused by overshooting the steady state voltage value at the buffer output can be avoided. Hence, the device and methods taught herein can speed the transitioning of signals in low-voltage devices while reducing the noise and interference produced by such a transition. Note that the term "providing" as it relates to current herein (e.g., providing current) is understood to mean both the sourcing and sinking of current.

In the embodiments disclosed herein, the threshold voltage may be a threshold voltage of a transistor of the current boost module 108 that typically range from 0.25 volts to 0.7 volts. In one embodiment, complimentary metal oxide semiconductor (CMOS) transistors are utilized and the threshold voltage of transistors of current boost module 108 are matched to transistors of receive/drive device 106. Alternatively, the transistors of current boost module 108 can be adjusted by the signal labeled $V_{THADJ}$, which can be a bias reference for the n-well bodies and p-well bodies of transistors of current boost module 108, whereby adjusting values $V_{thadj}$ a propagation speed of signals propagating through current boost module 108 can be adjusted.

Figure 2:
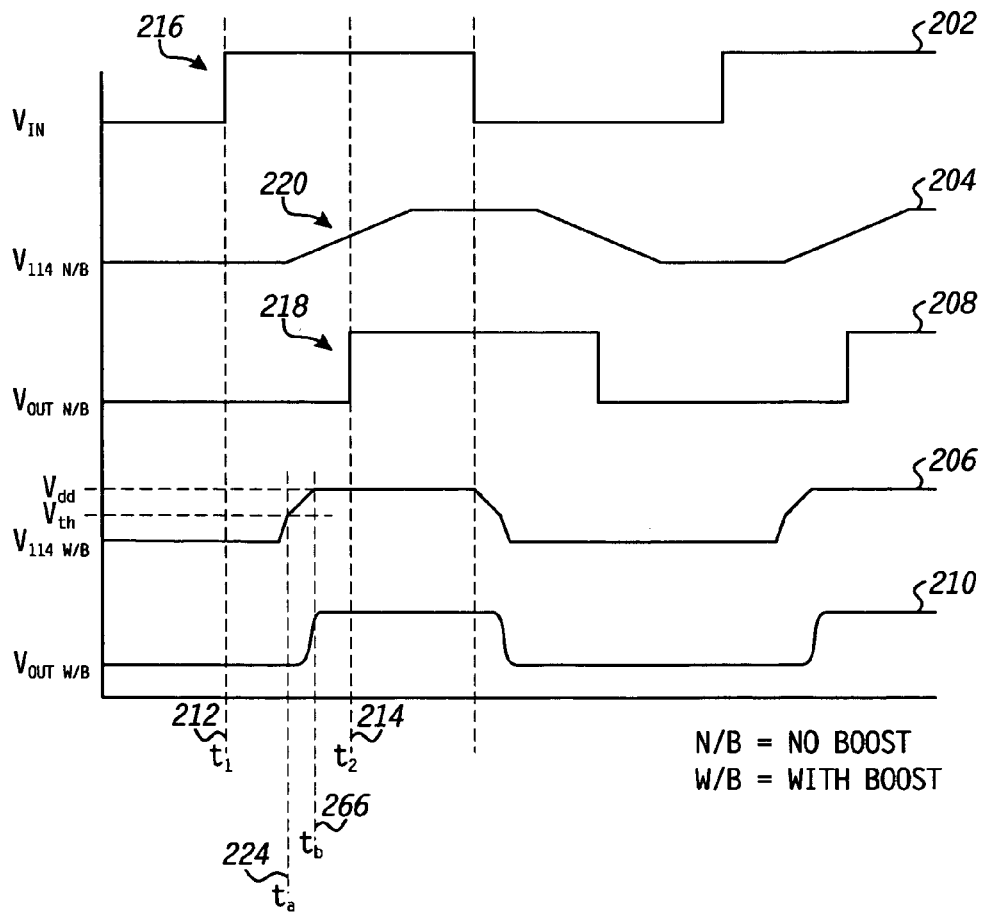
FIG. 2 is a graphical illustration of timing diagrams that illustrate waveforms that can be generated by systems described herein.

Referring to FIG. 2, a graph of exemplary waveforms for a switching module such as the switching module of FIG. 1 is illustrated. It will be appreciated that for simplicity and clarity of illustration, waveforms illustrated in FIG. 2 have not necessarily been drawn to scale nor does the graph accurately exemplify precise timing relationships. For example, the magnitude or size of the waveforms and the delays of some of the waveform transitions may be exaggerated relative to other waveform attributes.

The input voltage $V_{IN}$ represented by waveform 202 is an idealized input signal at the input of buffer 104 in FIG. 1. Without a boost current present, a buffer output voltage ($V_{114\ N/B}$) can be slow to transition as is illustrated by the slope of rising transition 220 of waveform 204. When the voltage at interconnect 114 ($V_{out\ N/B}$) is slow to change, a receive/drive device is also slow to transition as illustrated by idealized transition 118 of waveform 208. Generally, when transition edge 220 on interconnect 114 reaches the threshold voltage of the receive/drive circuit, (represented at time t2) the output of the receive drive circuit (represented by $V_{out}$) will begin transitioning between states. Note that waveform 208 is also illustrated as an idealized signal to illustrate a definitive switching delay between rising transition 216 and rising transition 218.

Without a current boost module to assist the transition, e.g., by increasing the slew rate of the signal at interconnect 114, the time required to transition a signal from a low logic state, e.g., 0 volts, to a high logic state, e.g., 1.3 volts, and back to a low logic state can be so slow as to create unacceptable delays in circuit response. Waveform 208 illustrates that without the presence of a boost current, a signal delay between the input of the switching module ($V_{IN}$) and the output of the switching module ($V_{OUT}$) is represented by the time between $t_1$ (212) and $t_2$ (214).

With a current boost module to provide a boost current to the interconnect 114, the voltage at interconnect 114 of FIG. 1 can be driven to the threshold voltage of the receive/drive device more quickly as illustrated by waveforms 206 and 210 which represent the voltage at interconnect 114 when the current is boosted and at $V_{out}$, respectively. Thus, waveform 210 ($V_{OUT}$ with a boost) illustrates an output signal from receive/drive circuit 106 when the interconnect at the input of the receive/drive circuit 106 is provided with a boost current.

An exemplary delay of a logic transition of $V_{out}$ of switching module using a boost current is represented by the time delay between the rising edge 216 of VIN at time $t_1$ and the rising edge of waveform 206 at time $T_a$. Thus, the switching delay that occurs between $t_1$ and $t_2$ represents a switching delay for a switching module that does not utilize a boost current, while the switching delay that occurs between t, and ta representing a switching delay for a switching module that does utilize a boost current. A switching module with a boost circuit, such as the one disclosed herein, can reduce switching delays and overcome shortcomings of low voltage designs by increasing the switching speed of signals at interconnects while controlling switching noise. This increased switching speed at a specific load (e.g., interconnect) can result in reduced signal propagation delay, from device input to device output and improved system performance.

Slew rate is generally defined as the rate of change of the voltage over time. Thus, the slope of rising transition 220 of $V_{114}$ with no boost depicts a slew rate of the signal provided by a typical buffer to a receive/drive device. An input capacitance on the receive/drive device can cause such a slow rise and fall rate.

Signals having low slew rates can cause significant dead time in devices because no signal switching activity occurs at the source/drain electrodes of transistors of the devices during the period when a signal at their gates is transitioning to the transistors' threshold voltage. Therefore, the effect of a low slew rate is compounded from component-to-component of a device as each component output also tends to transition slowly. In accordance with the disclosure herein, the switching delay, or dead time, a switching device can be reduced increasing the slew rate of a signal at a load associated the device. In a particular embodiment, the boost current can improve the slew rate of the illustrated systems by more than 0.5V/ns, thereby facilitating reduced dead time.

It can be appreciated by examining waveform 206, that between times $t_1$ 212 and $t_2$ 214 different transition phases of a waveform transition occur. From a steady state condition, typically 0 volts, $V_{114\ W/B}$ can rise during a boost phase that ends at time $t_a$ at a faster slew rate than during a soft transition phase at a second transition portion of the transition between $t_a$ and $t_b$.

It will be appreciated that signal 206 quickly rises during the boost phase (i.e. from zero volts to a voltage at or past the threshold voltage (Vth) of the receiving circuit and when the boost current is removed, the buffer can continue to drive the signal to a steady state voltage during the soft transition phase but at a reduced slew rate. When the signal at the input of the receive/drive circuit reaches the threshold voltage of the receive/drive circuit, the output of the receive drive circuit will begin to transition.

Referring to FIG. 3, a specific embodiment of an exemplary circuit corresponding to switching device 100 of FIG. 1 is illustrated. Specifically, FIG. 3 illustrates an inverter 304 corresponding to buffer 104 of FIG. 1, a current boost module 308 corresponding to module 108 of FIG. 1, and a module 306 corresponding to receive/drive module 106 of FIG. 1.

Current boost module 308 includes a voltage comparator 391, a voltage comparator 392, a p-type CMOS transistor 395, a p-type CMOS transistor 396, an n-type CMOS transistor 397, and an n-type CMOS transistor 398.

Voltage comparator 391 has an input coupled to the output of buffer 304 and an output. Voltage comparator 392 has an input coupled to the output of buffer 304 and an output. In one embodiment, voltage comparators 391 and 392 have transistors matched to transistors 385 and 386 of the receive/drive device 306 so that they transition at the same voltage at interconnect 314. Alternatively, by adjusting signal $V_{thadj}$ the voltage thresholds of voltage comparators 392 and 392 can be modified to switch at somewhat different voltages than the transistors of receive/drive device 306.

Transistor 395 of module 208 has a gate electrode (control electrode) connected to the input of buffer 304, a source electrode (current electrode) connected to a voltage reference node that provides a supply voltage (V+) reference, and a drain electrode. Transistor 396 has a gate electrode connected to the output of delay module 391, a source electrode connected to the drain electrode of transistor 395 and a drain electrode. Transistor 397 has a gate electrode connected to the output of delay module 392, a drain electrode connected to the drain electrode of transistor 396, and a source electrode. Transistor 398 has a gate electrode connected to the input of buffer 304, a drain electrode connected to the source of transistor 397, and a source electrode connected to a voltage reference node that provides a ground voltage reference. Receive/Drive Module 306 comprises a p-type transistor 385, an n-type transistor 386, and a capacitor 387.

Capacitor 387 has a first electrode connected to the output of buffer 304 through connector 314, and a second electrode. Transistor 385 has a gate electrode connected to the output of buffer 304 through connector 314, a source electrode connected to the voltage reference node, and a drain electrode. Transistor 386 has a gate electrode connected to the output of buffer 304 through connector 314, a drain electrode connected to the drain electrode of transistor 385, and a source electrode. In an alternate embodiment, transistor 387 can be connected between interconnect 314 and V+.

Operation of the electronic device of FIG. 3 is described using logic states referred to as HIGH (V+) and LOW (GND). During an initial steady state condition, $V_{IN}$ is LOW causing transistor 395 to be on, and transistor 398 to be off. In addition, $V_{IN}$ being LOW causes a HIGH signal at the output of buffer 304, and therefore at interconnect 341. In steady state the HIGH logic value at the buffer 304 results in a HIGH being provided to the gate electrodes of transistors 396 and 397, through delay elements 391 and 392, causing transistor 396 to be off, and transistor 397 to be on.

As a further result of the steady state condition, whereby a LOW signal is at $V_{IN}$, a tri-state condition exists at node 390 (thereby indicating no boost current is being provided to interconnect 314), as transistors 396 and 398 are both off.

As $V_{IN}$ begins to transition from LOW to HIGH, there will be a delay before buffer 304 will begin to transition. This delay is based upon how long it takes $V_{IN}$ to transition from LOW to the voltage threshold of transistors (not shown) that make up buffer 304. Similarly, transistor 398 will begin to turn on, and therefore conduct current, when $V_{IN}$ reaches the Vt of transistor 398 (note that at the same time transistor 395 will be transitioning off as a result of this transition). At the time when transistor 398 begins to conduct current, the states of transistors 396 and 397 remain unaffected, as the change in $V_{IN}$ has not yet propagated through buffer 304 and voltage comparators 391 and 392 to the gates of transistors 396 and 397. As a result, boost current will be provided to the interconnect 314 to speed up the signal transition at interconnect 314. However, once the transitioning signal propagates to the output of voltage comparator 392, thereby providing a LOW to transistor 397 and turning it off, the boost current will stop being provided to the interconnect 314. In this manner, a faster transition of a signal at interconnect 314 can occur.

It will be appreciated that during a subsequent transition of $V_{IN}$ from HIGH to LOW boost current will be provided in a similar manner through transistors 395 and 396 during a signal transition period. Note that current is considered to be provided to the interconnect 314, whether the current is being sourced or sinked by current boost module 308.

Figure 4:
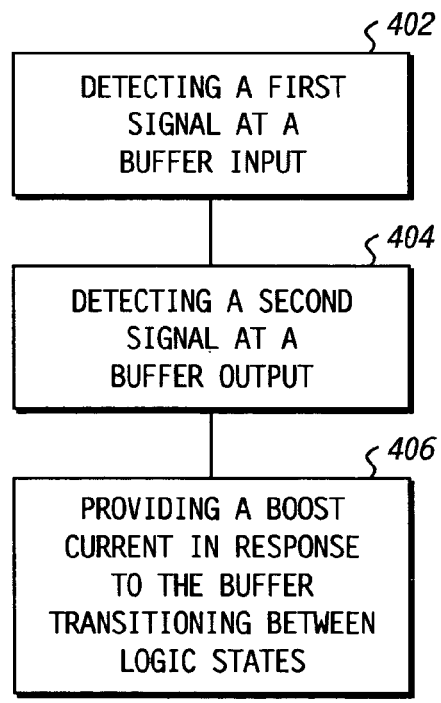
FIG. 4 is a flow diagram of an exemplary method for reducing a transition time of a line driver device in accordance with a specific embodiment of the present disclosure.

Referring to FIG. 4, an exemplary method for reducing signal propagation delay is provided. A transitioning input signal is provided to a buffer and to a current boost module, whereby, a block 402 of FIG. 4, the current boost module detects the input signal. An output signal of the buffer can be detected as a second input signal at block 404 by the current boost module. A boost current is provided in response to the detected first and second signals at block 408. The boost current can be provided during an initial portion of the rise time to reduce a dead time between a signal presence on the input node and the transition of the output node of a switching module, but be stopped prior to the signal fully transitioning to avoid overshoot.

Additionally, future data transmission subsystems or future circuits with similar design challenges or issues could be implemented in accordance with the teachings herein. Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. Accordingly, the present disclosure is not intended to be limited to the specific form set forth herein, but on the contrary, it is intended to cover such alternatives, modifications, and equivalents, as can be reasonably included within the spirit and scope of the disclosure.

The invention claimed is:

1. An electronic device comprising:
a buffer comprising an input and an output;
an interconnect coupled to the output of the buffer; and
a current boost module comprising a first input coupled to the buffer input, a second input coupled to the interconnect, a third input to receive an adjustable threshold voltage, and an output coupled to the interconnect, the current boost module to detect when the buffer is transitioning between logic states based on the adjustable threshold voltage and to provide a boost current in response to detecting a signal transition between logic states at the interconnect has not completed to increase a rate of the signal transition at the interconnect in response to detecting the signal transition.

2. The device as in claim 1, further comprising a receive/drive device comprising an input coupled to the interconnect, and an output, the receive/drive device configured to produce an output signal at its output responsive to a signal at its input.

3. The device as in claim 2, wherein the input of the receive/drive device is responsive to a voltage that varies between 0 volts and 1.3 volts.

4. The device as in claim 3, wherein the receive/drive device is a data bus driver.

5. The device as in claim 3, further comprising one of a video or audio module coupled to the output of the receive/drive device.

6. The device as in claim 3, wherein a threshold voltage of the receive/drive device is between approximately 0.5 volts and 0.7 volts.

7. The device of claim 1, wherein the current boost module is configured to detect when the buffer is transitioning between logic states based on the adjustable threshold voltage based on a comparison of the adjustable threshold voltage to a voltage at the interconnect.

8. The device of claim 1, wherein the current boost module further comprises:
   a first comparator comprising a first input coupled to the interconnect, a second input configured to receive the threshold voltage, and an output; and
   a second comparator comprising a first input coupled to the interconnect, a second input configured to receive the threshold voltage, and an output, wherein the current boost module provides the boost current based on the output of the first comparator and the output of the second comparator.

9. The device of claim 8, wherein the current boost module further comprises:
   a first transistor of a first connectivity type comprising a first current electrode coupled to a voltage reference, a second current electrode, and a control electrode coupled to the input of the buffer;
   a second transistor of the first connectivity type comprising a first current electrode coupled to the second current electrode of the first transistor, a second current electrode coupled to the interconnect, and a control electrode coupled to the output of the first comparator;
   a third transistor of a second connectivity type comprising a first current electrode coupled to the interconnect, a second current electrode, and a control electrode coupled to the output of the second comparator; and
   a fourth transistor of the second connectivity type comprising a first current electrode coupled to the second current electrode of the third transistor, a second current electrode coupled to a second voltage reference, and a control electrode coupled to the input of the buffer.

10. A method for reducing switching delay of an electronic device comprising:
    detecting a first signal at an input of a buffer;
    detecting a second signal at an output of the buffer;
    based on a comparison of the second signal to an adjustable threshold voltage, providing a boost current to an interconnect coupled to the output of the buffer when it is determined in response to detecting the first and second signal that the buffer is in transition between logic states, the boost current to increase a rate of the transition.

11. The method of claim 10, wherein providing the boost current occurs only during a portion of the buffer's transition between logic states.

12. The method of claim 10, wherein the input signal has a voltage range from between 0 volts and 1.3 volts.

13. The method of claim 10, wherein providing the boost current occurs between when an input signal on the input of the buffer is received and when an output of the buffer transitions to a different state.

14. The method of claim 13, wherein providing the current boost increases a slew rate at the interconnect to reduce a signal transition delay between the input of the buffer and a corresponding signal transition at the output of a device having an input coupled to the interconnect.

15. The method of claim 10, wherein providing the boost current increases a slew rate at the interconnect by more than approximately 0.5V/ns.

16. The method of claim 10, further comprising transmitting data over a multi-destination data bus via a receive/drive device that is responsive to a signal at the interconnect.

17. The method of claim 10, wherein boosting the current only occurs during a portion of the second signal's transition.

18. The method of claim 17, wherein the portion of the second signal's transition during which boosting the current occurs is based upon a voltage threshold of a transistor.

* * * * *